United States Patent
Park et al.

(10) Patent No.: US 12,074,602 B2
(45) Date of Patent: Aug. 27, 2024

(54) DUTY DETECTION CIRCUIT, A DUTY CORRECTION CIRCUIT, AND A SEMICONDUCTOR APPARATUS USING THE DUTY CORRECTION CIRCUIT

(71) Applicant: SK hynix Inc., Icheon-si (KR)

(72) Inventors: Gyu Tae Park, Icheon-si (KR); Young Suk Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 26 days.

(21) Appl. No.: 17/983,134

(22) Filed: Nov. 8, 2022

(65) Prior Publication Data

US 2023/0336164 A1    Oct. 19, 2023

(30) Foreign Application Priority Data

Apr. 13, 2022    (KR) .................. 10-2022-0045776

(51) Int. Cl.
*H03K 3/017*    (2006.01)
*G06F 1/08*    (2006.01)
*G06F 1/12*    (2006.01)

(52) U.S. Cl.
CPC .............. *H03K 3/017* (2013.01); *G06F 1/08* (2013.01); *G06F 1/12* (2013.01)

(58) Field of Classification Search
None
See application file for complete search history.

(56) References Cited

U.S. PATENT DOCUMENTS

| | | | |
|---|---|---|---|
| 9,590,606 B2 | 3/2017 | Kitagawa et al. | |
| 11,777,506 B2* | 10/2023 | Song | H03L 7/085 327/158 |
| 2008/0061851 A1 | 3/2008 | Jeon | |
| 2021/0409007 A1* | 12/2021 | Moslehi Bajestan | H03K 5/00006 |

FOREIGN PATENT DOCUMENTS

| | | |
|---|---|---|
| KR | 100962026 B1 | 6/2010 |
| KR | 1020240029185 A | 3/2024 |

* cited by examiner

*Primary Examiner* — Cassandra F Cox
(74) *Attorney, Agent, or Firm* — WILLIAM PARK & ASSOCIATES LTD.

(57) ABSTRACT

A duty correction circuit comprises a first delay circuit, a second delay circuit, a bang-bang driver, a duty detection circuit, and a delay control circuit. The first delay circuit delays an input clock signal to generate a first delayed clock signal. The second delay circuit delays the input clock signal based on a delay control signal to generate a second delayed clock signal. The bang-bang driver generates first and second driving clock signals from the first and second delayed clock signals based on a locking signal and a duty detection signal. The duty detection circuit may detect duty cycles of the first and second driving clock signals and generate the duty detection signal. The delay control circuit may generate the delay control signal and the locking signal based on the duty detection signal.

16 Claims, 7 Drawing Sheets

DUTY DETECTION CIRCUIT, A DUTY CORRECTION CIRCUIT, AND A SEMICONDUCTOR APPARATUS USING THE DUTY CORRECTION CIRCUIT

CROSS-REFERENCE TO RELATED APPLICATION

The present application claims priority under 35 U.S.C. § 119(a) to Korean application number 10-2022-0045776, filed on Apr. 13, 2022, in the Korean Intellectual Property Office, which is incorporated herein by reference in its entirety.

BACKGROUND

1. Technical Field

The present technology relates to an integrated circuit technology, and more particularly, to a duty detection circuit, a duty correction circuit, and a semiconductor apparatus including the duty correction circuit.

2. Related Art

An electronic device includes many electronic components, and among them, a computer system may include many semiconductor apparatuses including semiconductor devices. The semiconductor apparatuses constituting the computer system may communicate with each other by transmitting and/or receiving a system clock signal and data. The semiconductor apparatuses may operate in synchronization with a clock signal. The semiconductor apparatus may generate an internal clock signal from the system clock signal in order to match operation timing with another semiconductor apparatus or secure an operation margin, and may include a clock generation circuit for generating the internal clock signal.

The clock generation circuit may generate the internal clock signal by changing a phase of the system clock signal or dividing a frequency of the system clock signal. Furthermore, the clock generation circuit may generate a plurality of internal clock signals having different phases. The clock generation circuit may include a plurality of clock paths to generate the plurality of internal clock signals.

SUMMARY

In accordance with an embodiment of the present disclosure, a duty correction circuit may comprise a first delay circuit, a second delay circuit, a bang-bang driver, a duty detection circuit, and a delay control circuit. The first delay circuit may be configured to delay an input clock signal to generate a first delayed clock signal. The second delay circuit may be configured to delay the input clock signal based on a delay control signal to generate a second delayed clock signal. The bang-bang driver may be configured to drive the first and second delayed clock signals to generate a first driving clock signal and a second driving clock signal, and to delay the first and second driving clock signals based on a locking signal and a duty detection signal. The duty detection circuit may be configured to detect duty cycles of the first and second driving clock signals and generate the duty detection signal. The delay control circuit may be configured to generate the locking signal and the delay control signal based on the duty detection signal.

In accordance with an embodiment of the present disclosure, a duty correction circuit may comprise a first delay circuit, a second delay circuit, a bang-bang driver, a duty detection circuit, and a delay control circuit. The first delay circuit may be configured to delay an input clock signal to generate a first delayed clock signal. The second delay circuit may be configured to variably delay the input clock signal based on a delay control signal to generate a second delayed clock signal. The bang-bang driver may be configured to drive the first and second delayed clock signals to generate a first driving clock signal and a second driving clock signal. The bang-bang driver may be configured to delay the first and second driving clock signals based on a locking signal and a duty detection signal. The duty detection circuit may be configured to detect duty cycles of the first and second driving clock signals and generate the duty detection signal. The delay control circuit may be configured to: generate the delay control signal and the locking signal based on the duty detection signal, output the delay control signal based on the duty detection signal when the locking signal is disabled, and block output of the delay control signal when the locking signal is enabled.

In accordance with an embodiment of the present disclosure, a duty detection circuit may comprise an edge trigger circuit, a duty detector, a comparator, and a validity determiner. The edge trigger circuit may be configured to generate a reference clock signal and a comparison clock signal based on a first input clock signal and a second input clock signal. The duty detector may be configured to generate a first output signal based on a duty cycle of the reference clock signal and a second output signal based on a duty cycle of the comparison clock signal. The comparator may be configured to compare the first and second output signals and generate a duty detection signal. The validity determiner may be configured to verify validity of the first and second output signals and generate a valid determination signal.

DETAILED DESCRIPTION

Specific structural or functional descriptions disclosed herein are merely illustrative for the purpose of describing some embodiments according to concepts of the present disclosure. Embodiments according to concepts of the present disclosure may be implemented in various forms, and should not be construed as being limited to the specific embodiments set forth herein.

Various embodiments are described with reference to the accompanying drawings in order for those skilled in the art to be able to implement these embodiments, as well as other embodiments in keeping with the technical spirit of the present disclosure.

Figure 1:
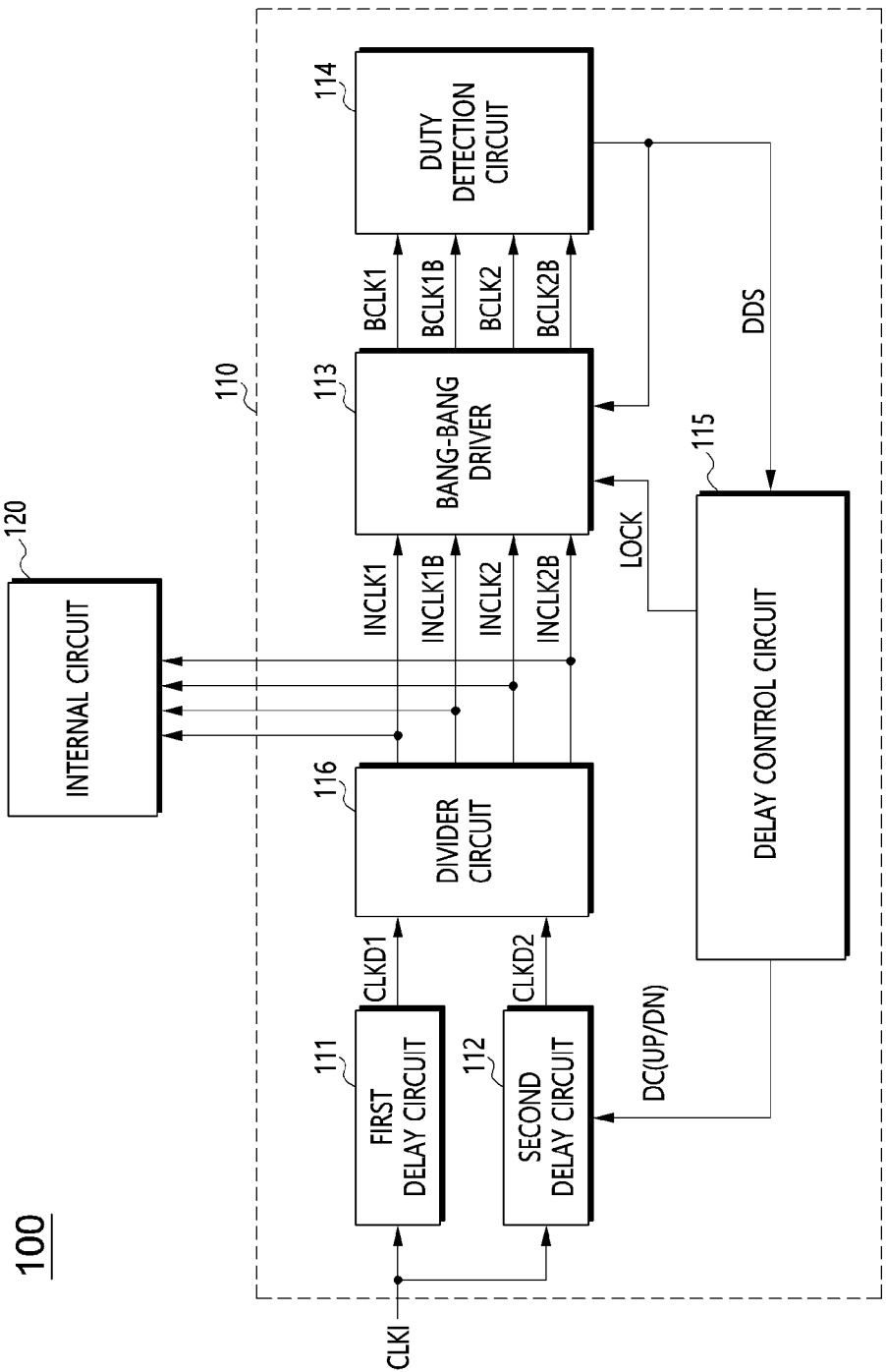
FIG. 1 is a diagram illustrating an example configuration of a semiconductor apparatus in accordance with an embodiment of the present disclosure.

FIG. 1 is a diagram illustrating an example configuration of a semiconductor apparatus in accordance with an embodiment of the present disclosure. Referring to FIG. 1, a semiconductor apparatus 100 may include a duty correction circuit 110 and an internal circuit 120. The duty correction circuit 110 may receive an input clock signal CLKI and correct a duty cycle of the input clock signal CLKI. The duty correction circuit 110 may generate a plurality of internal clock signals from the input clock signal CLKI. The duty correction circuit 110 may correct the duty cycle of the input clock signal CLKI so that the plurality of internal clock signals may have a constant duty cycle. The internal circuit 120 may receive the plurality of internal clock signals generated by the duty correction circuit 110. The internal circuit 120 may operate based on the plurality of internal clock signals. The internal circuit 120 may include all logic circuits capable of processing an arbitrary signal in synchronization with at least one of the plurality of internal clock signals.

In general, when the duty correction circuit 110 completes a duty correction operation on the input clock signal CLKI and enables a locking signal, the internal clock signal may be subjected to bang-bang. The term "enable" in "enables a locking signal" may mean that the locking signal is asserted. Similarly, the term "disable" as in "disables a locking signal" may mean that the locking signal is deasserted. The term "bang-bang" may be defined as the duty cycle of the input clock signal being alternately changed above and below a target duty cycle in a target duty cycle range when the locking signal is enabled. For example, the target duty cycle may be a ratio of a high-level pulse period to a low-level pulse period of a reference internal clock signal among the plurality of internal clock signals. Assuming that a duty cycle of the reference internal clock signal is 50:50, when a duty cycle of an internal clock signal, other than the reference internal clock signal, is corrected to approach the target duty cycle, the duty cycle of the internal clock signal may continuously alternate, for example, between (50+a): (50−a) and (50−a):(50+a). The duty cycle of the internal clock signal may then be said to continuously bang bang, which may cause a problem in the performance of the internal circuit 120 operating in synchronization with another internal clock signal. On the other hand, when the duty cycle of the internal clock signal is kept substantially constant without banging, it might not be possible to detect that the duty cycle of the internal clock signal is out of the target duty cycle range. Therefore, it may be difficult to perform a duty correction operation again when the locking signal is enabled once. When the locking signal is enabled by performing the duty correction operation, the duty correction circuit 110 may provide the internal circuit 120 with an internal clock signal substantially maintaining a constant duty cycle and continuously detecting banging of a duty cycle of the internal clock signal.

The duty correction circuit 110 may include a first delay circuit 111, a second delay circuit 112, a bang-bang driver 113, a duty detection circuit 114, and a delay control circuit 115. The first delay circuit 111 may receive the input clock signal CLKI and generate a first delayed clock signal CLKD1 by delaying the input clock signal CLKI. A delay amount and/or a delay time of the first delay circuit 111 may be fixed to a default value. The fixed delay amount of the first delay circuit 111 may be set to a value determined by design and/or implementation requirements. Various embodiments may allow setting the fixed delay amount to an arbitrary value. Various embodiments may allow varying fixed delay from the default value. In some embodiments, the default delay amount of the first delay circuit 111 may be substantially identical to a default delay amount of the second delay circuit 112. Accordingly, when the fixed delay amount for the first delay circuit 111 is changed, the fixed delay amount for the second delay circuit 112 may also be changed similarly.

The second delay circuit 112 may receive the input clock signal CLKI and a delay control signal DC. The second delay circuit 112 may generate a second delayed clock signal CLKD2 by variably delaying the input clock signal CLKI based on the delay control signal DC. A delay amount and/or a delay time of the second delay circuit 112 may be changed based on the delay control signal DC. The default delay amount of the second delay circuit 112 may be substantially identical to the default delay amount of the first delay circuit 111. When the delay amount of the second delay circuit 112 is increased by the delay control signal DC, the second delayed clock signal CLKD2 may have a delayed phase compared to the first delayed clock signal CLKD1. When the delay amount of the second delay circuit 112 is decreased by the delay control signal DC, the second delayed clock signal CLKD2 may have an advanced phase compared to the first delayed clock signal CLKD1. The delay control signal DC may include an up signal UP and a down signal DN. For example, when the up signal UP is received, the second delay circuit 112 may increase the delay amount of the second delay circuit 112. When the down signal DN is received, the second delay circuit 112 may decrease the delay amount of the second delay circuit 112. Various embodiments may use other forms of delay control signal DC. For example, there may only be one signal, or more than two signals. Additionally, the delay control signal DC may be analog or digital.

The bang-bang driver 113 may receive a plurality of two or more internal clock signals. The plurality of internal clock signals may be generated based on the first and second delayed clock signals CLKD1 and CLKD2. For example, the plurality of internal clock signals may include a first internal clock signal INCLK1 and a second internal clock signal INCLK2. In an embodiment, the first delayed clock signal CLKD1 may be provided as the first internal clock signal INCLK1 and the second delayed clock signal CLKD2 may be provided as the second internal clock signal INCLK2.

In an embodiment, the plurality of internal clock signals may further include a complementary signal INCLK1B of the first internal clock signal INCLK1 and a complementary signal INCLK2B of the second internal clock signal INCLK2. A complementary signal of the first delayed clock signal CLKD1 may be provided as the complementary signal INCLK1B, and complementary signal of the second delayed clock signal CLKD2 may be provided as the complementary signal INCLK2B.

In an embodiment, the duty correction circuit 110 may generate the plurality of internal clock signals by dividing frequencies of the first and second delayed clock signals CLKD1 and CLKD2. The duty correction circuit 110 may further include a divider circuit 116. The divider circuit 116 may generate the first internal clock signal INCLK1 and the second internal clock signal INCLK2 by dividing the frequencies of the first and second delayed clock signals CLKD1 and CLKD2.

The divider circuit 116 may divide the frequency of the first delayed clock signal CLKD1 to provide divided clock signals having a phase difference of substantially 180°, where the divided clock signals may be provided as the first internal clock signal INCLK1 and the complementary signal INCLK1B of the first internal clock signal. Similarly, the divider circuit 116 may divide the frequency of the second delayed clock signal CLKD2 to provide divided clock signals having a phase difference of substantially 180°, where the divided clock signals may be provided as the second internal clock signal INCLK2 and the complementary signal INCLK2B of the second internal clock signal. Accordingly, the divider circuit 116 may divide the frequencies of the first and second delayed clock signals CLKD1 and CLKD2 by a factor of n, where n may be an integer equal to or larger than 2. Some embodiments of the disclosure may allow dividing the delayed clock signals CLKD1 and CLKD2 by a non-integer value.

Some embodiments of the disclosure might not divide the delayed clock signals CLKD1 and CLKD2. Accordingly, in some embodiments the divider circuit 116 might not be present. Therefore, the delayed clock signals CLKD1 and CLKD2 from the first and second delay circuits 111 and 112 may be sent directly to the bang-bang driver 113, and to the Internal Circuit 120. In other embodiments, the divider circuit 116 may be present, but the divider circuit 116 may be controlled to allow the delayed clock signals to be output without being divided.

Figure 2:
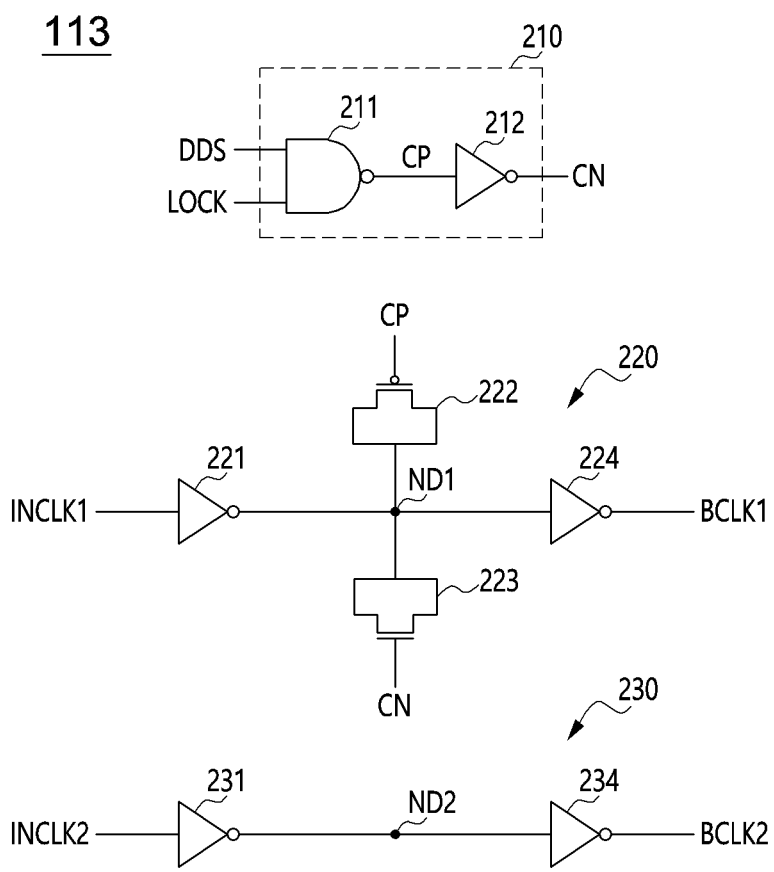
FIG. 2 is a diagram illustrating an example bang-bang driver in accordance with an embodiment of the present disclosure.

The bang-bang driver 113, further described with respect to FIG. 2, may receive the plurality of internal clock signals, and generate a plurality of driving clock signals by driving the plurality of internal clock signals. The bang-bang driver 113 may receive a locking signal LOCK and a duty detection signal DDS for use in generation of the driving clock signals. The locking signal LOCK may be provided from the delay control circuit 115 to be described below and the duty detection signal DDS may be provided from the duty detection circuit 114 to be described below.

The bang-bang driver 113 may generate the plurality of driving clock signals by delaying the plurality of internal clock signals based on the locking signal LOCK and the duty detection signal DDS. When the locking signal LOCK is enabled, the bang-bang driver 113 may generate the plurality of driving clock signals by delaying some of the plurality of internal clock signals compared to one or more others of the plurality of internal clock signals based on the duty detection signal DDS.

The bang-bang driver 113 may receive the first internal clock signal INCLK1 and the second internal clock signal INCLK2 and generate a first driving clock signal BCLK1 and a second driving clock signal BCLK2. When the plurality of internal clock signals further include the complementary signal INCLK1B of the first internal clock signal and the complementary signal INCLK2B of the second internal clock signal, the bang-bang driver 113 may further generate a complementary signal BCLK1B of the first driving clock signal BCLK1 and a complementary signal BCLK2B of the second driving clock signal BCLK2.

The bang-bang driver 113 may generate the first driving clock signal BCLK1 by driving the first internal clock signal INCLK1, and generate the complementary signal BCLK1B of the first driving clock signal by driving the complementary signal INCLK1B. The bang-bang driver 113 may generate the second driving clock signal BCLK2 by driving the second internal clock signal INCLK2, and generate the complementary signal BCLK2B of the second driving clock signal by driving the complementary signal INCLK2B.

The bang-bang driver 113 may generate the first driving clock signal BCLK1 and the second driving clock signal BCLK2 by delaying the first internal clock signal INCLK1 and the second internal clock signal INCLK2 based on the locking signal LOCK and the duty detection signal DDS. When the locking signal LOCK is enabled, the bang-bang driver 113 may delay one of the first internal clock signal INCLK1 and the second internal clock signal INCLK2 compared to the other based on the duty detection signal DDS. When the locking signal LOCK is enabled, the bang-bang driver 113 may delay one of the complementary signal INCLK1B of the first internal clock signal and the complementary signal INCLK2B of the second internal clock signal compared to the other based on the duty detection signal DDS.

When the locking signal LOCK is disabled, the bang-bang driver 113 may delay the first and second internal clock signals INCLK1 and INCLK2 by substantially the same delay amount, and delay the complementary signals INCLK1B and INCLK2B of the first and second internal clock signals by substantially the same delay amount. Accordingly, when the locking signal LOCK is disabled, the bang-bang driver 113 may generate the first driving clock signal BCLK1 and its complementary signal BCLK1B, the second driving clock signal BCLK2 and its complementary signal BCLK2B.

The driving clock signals BCLK1 and BCLK2 and their respective complementary signals BCLK1B and BCLK2B may have substantially the same phases as the internal clock signals INCLK1 and INCLK2 and their respective complementary signals INCLK1B and INCLK2B. When the locking signal LOCK is enabled, the bang-bang driver 113 may substantially maintain one of the phases of the first and second internal clock signals INCLK1 and INCLK2, and change the other one of the phases based on the duty detection signal DDS to change a phase difference between the first and second driving clock signals BCLK1 and BCLK2. Furthermore, the bang-bang driver 113 may substantially maintain one of the phases of the complementary signals INCLK1B and INCLK2B of the first and second internal clock signals, and change the other one of the phases based on the duty detection signal DDS to change a phase difference between the complementary signals BCLK1B and BCLK2B of the first and second driving clock signals.

The duty detection circuit 114 may receive the plurality of driving clock signals from the bang-bang driver 113. The duty detection circuit 114 may receive at least the first driving clock signal BCLK1 and the second driving clock signal BCLK2, and detect duty cycles of the first and second driving clock signals BCLK1 and BCLK2 to generate the duty detection signal DDS. For example, the duty detection circuit 114 may compare the duration of a high-level pulse period of the first driving clock signal BCLK1 with the duration of a high-level pulse period of the second driving clock signal BCLK2, and generate the duty detection signal DDS according to the comparison result.

When the high-level pulse period of the first driving clock signal BCLK1 is longer than the high-level pulse period of the second driving clock signal BCLK2, the duty detection circuit 114 may generate the duty detection signal DDS having a low logic level. When the high-level pulse period of the first driving clock signal BCLK1 is shorter than the high-level pulse period of the second driving clock signal BCLK2, the duty detection circuit 114 may generate the duty detection signal DDS having a high logic level.

In an embodiment, the duty detection circuit 114 may generate pulse signals that are triggered according to edges of the first and second driving clock signals BCLK1 and BCLK2, and detect duty cycles of the pulse signals to generate the duty detection signal DDS. The edges of the first and second driving clock signals BCLK1 and BCLK2 selected for generating the pulse signals may be changed to use either rising edges or falling edges. The duty detection circuit 114 may generate the duty detection signal DDS every update cycle based on the first and second driving clock signals BCLK1 and BCLK2. The update cycle may be defined as a cycle that the duty detection circuit 114 detects the duty cycles of the first and second driving clock signals BCLK1 and BCLK2. In an embodiment, the update cycle may be defined as a cycle that information or value of the delay control signal DC is changed. All duty detection circuits capable of detecting a duty cycle of an inputted clock signal and generating a duty detection signal may be applied as the duty detection circuit 114.

The duty detection circuit 114 may further receive the complementary signal BCLK1B of the first driving clock signal and the complementary signal BCLK2B of the second driving clock signal. The duty detection circuit 114 may detect duty cycles of the complementary signal BCLK1B of the first driving clock signal and the complementary signal BCLK2B of the second driving clock signal, and generate the duty detection signal DDS.

In an embodiment, the duty detection circuit 114 may compare a high-level pulse period of the complementary signal BCLK1B of the first driving clock signal with a high-level pulse period of the complementary signal BCLK2B of the second driving clock signal, and generate the duty detection signal DDS according to the comparison result.

In an embodiment, the duty detection circuit 114 may generate the duty detection signal DDS based on both the result of detecting the duty cycles of the first and second driving clock signals BCLK1 and BCLK2 and the result of detecting the duty cycles of the complementary signals BCLK1B and BCLK2B of the first and second driving clock signals.

In an embodiment, the duty detection circuit 114 may generate pulse signals that are triggered according to edges of the complementary signals BCLK1B and BCLK2B of the first and second driving clock signals, detect duty cycles of the pulse signals, and generate the duty detection signal DDS.

In an embodiment, the duty detection circuit 114 may generate pulse signals that are triggered according to edges of the first driving clock signal BCLK1, the complementary signal BCLK1B of the first driving clock signal, the second driving clock signal BCLK2, and the complementary signal BCLK2B of the second driving clock signal, detect duty cycles of the pulse signals, and generate the duty detection signal DDS.

The delay control circuit 115 may receive the duty detection signal DDS from the duty detection circuit 114. The delay control circuit 115 may generate the delay control signal DC and the locking signal LOCK based on the duty detection signal DDS. The delay control circuit 115 may generate the delay control signal DC according to the logic level of the duty detection signal DDS. For example, when the duty detection signal DDS having a high logic level is received, the delay control circuit 115 may generate the up signal UP as the delay control signal DC, and when the duty detection signal DDS having a low logic level is received, the delay control circuit 115 may generate the down signal DN as the delay control signal DC.

When the locking signal LOCK is in the disabled state, the delay control circuit 115 may generate the delay control signal DC according to the logic level of the duty detection signal DDS. When the locking signal LOCK is enabled, even though the duty detection signal DDS is received, the delay control circuit 115 might not generate the delay control signal DC. When the locking signal LOCK is enabled, the delay control circuit 115 may block output of the delay control signal DC the second delay circuit 112.

When the duty correction operation of the duty correction circuit 110 is being performed, the delay control circuit 115 may substantially maintain the locking signal LOCK in the disabled state. When the duty correction operation of the duty correction circuit 110 is completed, the delay control circuit 115 may enable the locking signal LOCK. When the duty cycle of the first internal clock signal INCLK1 and the duty cycle of the second internal clock signal INCLK2 have reached the target duty cycle, the duty correction circuit 110 may enable the locking signal LOCK.

For example, the duty detection signal DDS may be at a logic level, whether a high logic level or a low logic level. When the duty detection signal DDS at the other logic level is received, the delay control circuit 115 may enable the locking signal LOCK. When the duty detection signal DDS having a high logic level and the duty detection signal DDS having a low logic level are alternately generated, the delay control circuit 115 may substantially maintain the enabled state of the locking signal LOCK. When the duty detection signal DDS is at a logic level, whether a high logic level or a low logic level, while the locking signal LOCK is enabled, the delay control circuit 115 may disable the locking signal LOCK. When the locking signal LOCK is disabled, the duty correction circuit 110 may perform the duty correction operation again.

FIG. 2 is a diagram illustrating an example bang-bang driver in accordance with an embodiment of the present disclosure. Referring to FIG. 2, the bang-bang driver 113 of FIG. 1 may include a bang-bang control circuit 210, a first driver 220, and a second driver 230. The bang-bang control circuit 210 may receive the duty detection signal DDS and the locking signal LOCK. The bang-bang control circuit 210 may generate a first switching signal CP and a second switching signal CN based on the duty detection signal DDS and the locking signal LOCK.

When the locking signal LOCK is in the disabled state, the bang-bang control circuit 210 may disable both the first and second switching signals CP and CN. When the locking signal LOCK is in the enabled state, the bang-bang control circuit 210 may enable the first and second switching signals CP and CN according to the logic level of the duty detection signal DDS. For example, the first switching signal CP may be an active low signal (asserted, or enabled, when at a low voltage level) and the second switching signal CN may be an active high signal (asserted, or enabled, when at a high voltage level).

Accordingly, when the duty detection signal DDS has a high logic level while the locking signal LOCK is enabled, the bang-bang control circuit 210 may enable both the first and second switching signals CP and CN. When the duty detection signal DDS has a low logic level while the locking signal LOCK is enabled, the bang-bang control circuit 210 may disable both the first and second switching signals CP and CN.

The first driver 220 may receive the first internal clock signal INCLK1 and generate the first driving clock signal BCLK1. The first driver 220 may delay the first internal clock signal INCLK1 based on the first and second switching signals CP and CN. When the first and second switching signals CP and CN are enabled, the first driver 220 may generate the first driving clock signal BCLK1 by delaying the first internal clock signal INCLK1, and when the first and second switching signals CP and CN are disabled, the first driver 220 may generate the first driving clock signal BCLK1 without substantially delaying the first internal clock signal INCLK1. Even when the first and second switching signals CP and CN are disabled, delay may occur due to the circuit delay of first and second inverters 221 and 224. However, this delay may be ignored because it is also present when the first and second switching signals CP and CN are enabled.

The second driver 230 may receive the second internal clock signal INCLK2 and generate the second driving clock signal BCLK2. Delay occurring when the second driver 230 drives the second internal clock signal INCLK2 may be substantially identical to that occurring when the first driver 220 drives the first internal clock signal INCLK1 while the first and second switching signals CP and CN are disabled. Accordingly, when the first and second switching signals CP and CN are disabled, the first and second drivers 220 and 230 may respectively generate the first and second driving clock signals BCLK1 and BCLK2 having substantially the same phase difference as that between the first and second internal clock signals INCLK1 and INCLK2. When the first and second switching signals CP and CN are enabled, the first driver 220 may generate the first driving clock signal BCLK1 by additionally delaying the first internal clock signal INCLK1. Therefore, the phase difference between the first and second driving clock signals BCLK1 and BCLK2 may be different than the phase difference between the first and second internal clock signals INCLK1 and INCLK2. When the first and second switching signals CP and CN are enabled, the phase of the first driving clock signal BCLK1 may be delayed compared to that of the second driving clock signal BCLK2.

The bang-bang control circuit 210 may include a NAND gate 211 and an inverter 212. The NAND gate 211 may receive the duty detection signal DDS and the locking signal LOCK and output the first switching signal CP. When the duty detection signal DDS having a high logic level is received while the locking signal LOCK is enabled to a high logic level, the NAND gate 211 may enable the first switching signal CP to a low logic level. When the locking signal LOCK is disabled to a low logic level or the duty detection signal DDS having a low logic level is received, the NAND gate 211 may disable the first switching signal CP to a high logic level. The inverter 212 may generate the second switching signal CN by inverting the first switching signal CP. When the first switching signal CP is enabled to a low logic level, the inverter 212 may enable the second switching signal CN to a high logic level, and when the first switching signal CP is disabled to a high logic level, the inverter 212 may disable the second switching signal CN to a low logic level.

The first driver 220 may include the first inverter 221, a first capacitor 222, a second capacitor 223, and the second inverter 224. The first inverter 221 may receive the first internal clock signal INCLK1, invert and drive the first internal clock signal INCLK1, and output an inverted driving signal to a first node ND1. The first capacitor 222 may have one end connected to the first node ND1 and the other end may receive the first switching signal CP. When the first switching signal CP is enabled, the first capacitor 222 may delay a signal of the first node ND1 by increasing a load on the first node ND1. The first capacitor 222 may be a P-channel MOS capacitor that receives the first switching signal CP through the gate thereof.

The second capacitor 223 may have one end connected to the first node ND1 and the other end may receive the second switching signal CN. When the second switching signal CN is enabled, the second capacitor 223 may delay the signal of the first node ND1 by increasing the load on the first node ND1. The second capacitor 223 may be an N-channel MOS capacitor whose gate receives the second switching signal CN. The second inverter 224 may receive the signal of the first node ND1, invert and drive the signal of the first node ND1 as the first driving clock signal BCLK1.

The second driver 230 may include a third inverter 231 and a fourth inverter 234. The third inverter 231 may receive the second internal clock signal INCLK2, invert and drive the second internal clock signal INCLK2, and output an inverted driving signal to a second node ND2. The fourth inverter 234 may receive a signal of the second node ND2, invert and drive the signal of the second node ND2 as the second driving clock signal BCLK2.

When the bang-bang driver 113 receives the complementary signal INCLK1B of the first internal clock signal and the complementary signal INCLK2B of the second internal clock signal, the bang-bang driver 113 may further include two drivers (not shown) for generating the complementary signals BCLK1B and BCLK2B of the first and second driving clock signals BCLK1 and BCLK2, respectively.

A driver for generating the complementary signal BCLK1B of the first driving clock signal by driving the complementary signal INCLK1B of the first internal clock signal may have substantially the same configuration as that of the first driver 220. A driver for generating the complementary signal BCLK2B of the second driving clock signal by driving the complementary signal INCLK2B of the second internal clock signal may have substantially the same configuration as that of the second driver 230.

Figure 3:
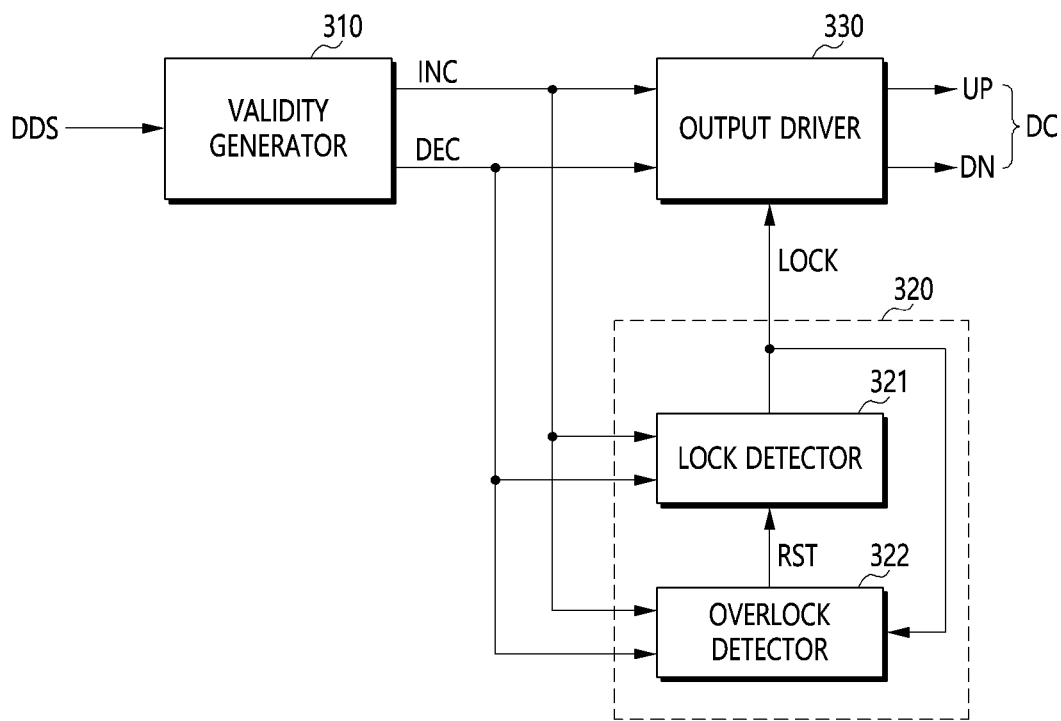
FIG. 3 is a diagram illustrating an example delay control circuit in accordance with an embodiment of the present disclosure.

FIG. 3 is a diagram illustrating an example delay control circuit in accordance with an embodiment of the present disclosure. Referring to FIG. 3, the delay control circuit 115 of FIG. 1 may include a validity generator 310, a locking detection circuit 320, and an output driver 330.

The validity generator 310 may receive the duty detection signal DDS from the duty detection circuit 114. The validity generator 310 may generate a phase increase signal INC and a phase decrease signal DEC based on the duty detection signal DDS. The validity generator 310 may generate one of the phase increase signal INC and the phase decrease signal DEC according to the logic level of the duty detection signal DDS. For example, when the duty detection signal DDS has a high logic level, the validity generator 310 may generate the phase increase signal INC but not the phase decrease signal DEC. When the duty detection signal DDS has a low logic level, the validity generator 310 may generate the phase decrease signal DEC but not the phase increase signal INC. The validity generator 310 may generate the phase increase signal INC and the phase decrease signal DEC in the form of pulse signals.

The locking detection circuit 320 may receive the phase increase signal INC and the phase decrease signal DEC from the validity generator 310. The locking detection circuit 320 may generate the locking signal LOCK based on the phase increase signal INC and the phase decrease signal DEC. The locking signal LOCK may be initialized in the disabled state. When one of the phase increase signal INC or the phase decrease signal DEC is continuously received, and then the other one is received, the locking detection circuit 320 may enable the locking signal LOCK. When the locking signal LOCK is enabled, receiving one of the phase increase signal INC or the phase decrease signal DEC by the locking detection circuit 320 may disable the locking signal LOCK.

The locking detection circuit 320 may include a lock detector 321 and an overlock detector 322. The lock detector 321 may receive the phase increase signal INC and the phase decrease signal DEC from the validity generator 310, and generate the locking signal LOCK based on the phase increase signal INC and the phase decrease signal DEC as described above.

In an embodiment, when the phase increase signal INC and the phase decrease signal DEC are alternately generated at least twice, the lock detector 321 may enable the locking signal LOCK.

The lock detector 321 may receive an enabled reset signal RST from the overlock detector 322. The lock detector 321 may disable the locking signal LOCK based on the enabled reset signal RST.

The overlock detector 322 may receive the locking signal LOCK from the lock detector 321, and receive the phase increase signal INC and the phase decrease signal DEC from the validity generator 310. The overlock detector 322 may generate the reset signal RST based on the locking signal LOCK, the phase increase signal INC, and the phase decrease signal DEC. The overlock detector 322 may be deactivated when the locking signal LOCK is in the disabled state. Accordingly, when the overlock detector 322 is deactivated, it might not assert the reset signal RST regardless of the state of the signals INC and DEC. The overlock detector 322 may be activated when the locking signal LOCK is in the enabled state. After the locking signal LOCK is enabled, when any one of the phase increase signal INC and the phase decrease signal DEC is continuously received, the overlock detector 322 may enable the reset signal RST.

The output driver 330 may receive the phase increase signal INC and the phase decrease signal DEC from the validity generator 310, and receive the locking signal LOCK from the locking detection circuit 320. The output driver 330 may generate the delay control signal DC based on the locking signal LOCK, the phase increase signal INC, and the phase decrease signal DEC. The output driver 330 may generate the delay control signal DC based on the phase increase signal INC and the phase decrease signal DEC when the locking signal LOCK is in the disabled state. For example, the output driver 330 may generate the up signal UP based on the phase increase signal INC and generate the down signal DN based on the phase decrease signal DEC. When the locking signal LOCK is enabled, the output driver 330 might not assert the delay control signal DC (the up signal UP and the down signal DN) regardless of the states of the phase increase signal INC and the phase decrease signal DEC.

Figure 4:
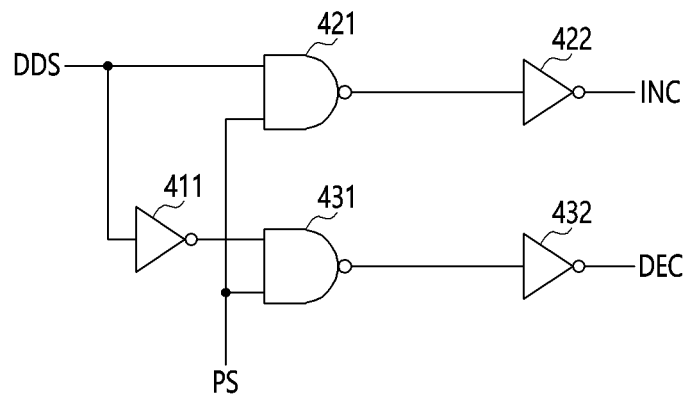
FIG. 4 is a diagram illustrating an example validity generator in accordance with an embodiment of the present disclosure.

FIG. 4 is a diagram illustrating an example validity generator in accordance with an embodiment of the present disclosure. Referring to FIG. 4, the validity generator 310 of FIG. 3 may include a first inverter 411, a first NAND gate 421, a second inverter 422, a second NAND gate 431, and a third inverter 432. The first inverter 411 may receive the duty detection signal DDS, and invert and drive the duty detection signal DDS to the second NAND gate 431. The first NAND gate 421 may receive the duty detection signal DDS and a pulse signal PS. The pulse signal PS may be a periodic signal with a pulse width that may vary. The second inverter 422 may receive an output of the first NAND gate 421, and invert and drive the output of the first NAND gate 421 as the phase increase signal INC.

The second NAND gate 431 may receive the pulse signal PS and the output of the first inverter 411. The third inverter 432 may receive output of the second NAND gate 431, and invert and drive the output of the second NAND gate 431 as the phase decrease signal DEC. Accordingly, when the duty detection signal DDS has a high logic level, the validity generator 310 may assert the phase increase signal INC to a high logic level according to a pulse width of the pulse signal PS. When the duty detection signal DDS has a low logic level, the validity generator 310 may assert the phase decrease signal DEC to a high logic level according to the pulse width of the pulse signal PS.

Figure 5:
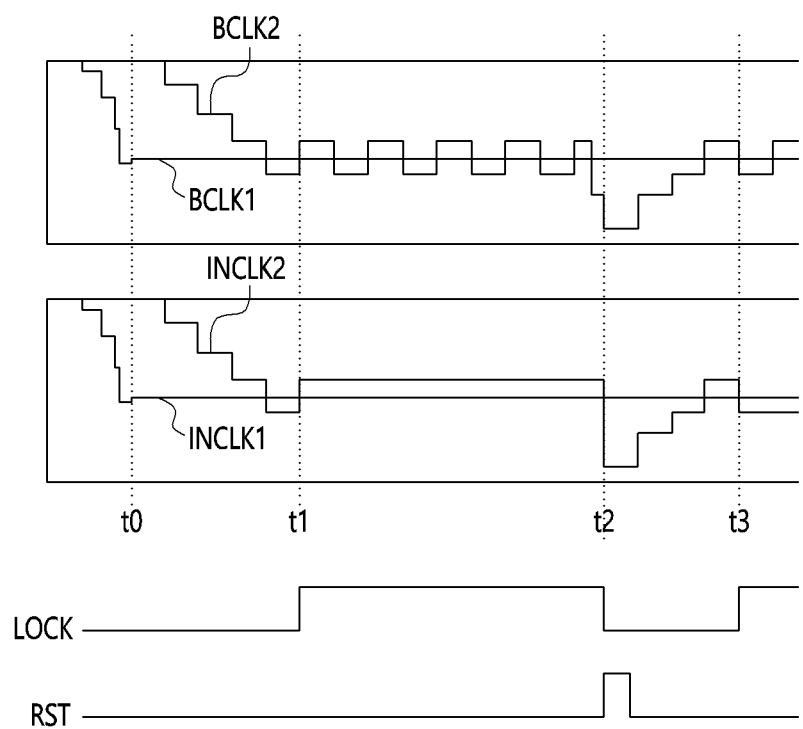
FIG. 5 is a timing diagram illustrating operations of an example duty correction circuit and an example semiconductor apparatus in accordance with an embodiment of the present disclosure.

FIG. 5 is a timing diagram illustrating operations of an example duty correction circuit and an example semiconductor apparatus in accordance with an embodiment of the present disclosure. In FIG. 5, the horizontal axis may denote time and the vertical axis may denote a phase of a clock signal. As the duty cycle of the clock signal gets larger or the phase of the clock signal is advanced more, the phase of the clock signal may be shown as a higher value on the vertical axis. As the duty cycle of the clock signal gets smaller or the phase of the clock signal is delayed more, the phase of the clock signal may be shown as a lower value on the vertical axis. The operations of the duty correction circuit 110 and the semiconductor apparatus 100 in accordance with an embodiment of the present disclosure will be described with reference to FIG. 1 to FIG. 5.

Before a duty correction operation is performed, the locking signal LOCK may be initialized to the disabled state. When there is a difference between the duty cycle of the first internal clock signal INCLK1 and the duty cycle of the second internal clock signal INCLK2, the duty correction circuit 110 may generate the delay control signal DC such that the duty cycle of the second internal clock signal INCLK2 may be substantially identical to the duty cycle of the first internal clock signal INCLK1.

As illustrated in FIG. 5, at t0, the duty cycle of the second internal clock signal INCLK2 may be larger than the duty cycle of the first internal clock signal INCLK1. Because the locking signal is in the disabled state, the bang-bang driver 113 may generate the first and second bang-bang clock signals BCLK1 and BCLK2 by delaying the first and second internal clock signals INCLK1 and INCLK2 by substantially the same time.

The duty detection circuit 114 may detect the duty cycles of the first and second bang-bang clock signals BCLK1 and BCLK2, and generate the duty detection signal DDS having a high logic level. The delay control circuit 115 may generate the phase increase signal INC based on the duty detection signal DDS, and output the up signal UP as the delay control signal DC based on the phase increase signal INC. The delay amount of the second delay circuit 112 may be increased based on the up signal UP, and the phases of the second delayed clock signal CLKD2 and the second internal clock signal INCLK2 may be delayed. The phase delay of the second internal clock signal INCLK2 may be repeated every update cycle until the duty cycle of the second internal clock signal INCLK2 is substantially identical to the duty cycle of the first internal clock signal INCLK1.

Just prior to t1, the duty cycle of the second internal clock signal INCLK2 may be smaller than the duty cycle of the first internal clock signal INCLK1. The duty detection circuit 114 may detect the duty cycles of the first and second bang-bang clock signals BCLK1 and BCLK2, and generate the duty detection signal DDS with a low logic level. The delay control circuit 115 may output the down signal DN as the delay control signal DC based on the duty detection signal DDS having the low logic level, and the delay amount of the second delay circuit 112 may be decreased.

At t1, as the delay amount of the second delay circuit 112 is decreased, the duty cycle of the second internal clock signal INCLK2 may be larger than the duty cycle of the first internal clock signal INCLK1. The lock detector 321 of the locking detection circuit 320 may detect that the duty detection signal DDS with a high logic level is received and then the duty detection signal DDS with a low logic level is received, and thus enable the locking signal LOCK.

When the locking signal LOCK is enabled, the output driver 330 of the delay control circuit 115 may block output of the phase increase signal INC and the phase decrease signal DEC as the delay control signal DC. Accordingly, the delay amount of the second delay circuit 112 might not be changed any more, and the first and second internal clock signals INCLK1 and INCLK2 may substantially maintain a constant duty cycle.

Because the internal circuit 120 operates by receiving the first and second internal clock signals INCLK1 and INCLK2 having a constant duty cycle without banging, the internal circuit 120 may exhibit constant and stable performance.

When the locking signal LOCK is enabled, the bang-bang control circuit 210 of the bang-bang driver 113 may selectively enable the first and second switching signals CP and CN according to the logic level of the duty detection signal DDS. When the duty detection signal DDS has a low logic level, the first and second switching signals CP and CN may be disabled.

As the delay amount of the second delay circuit 112 is decreased, the second bang-bang clock signal BCLK2 may have a larger duty cycle than the first bang-bang clock signal BCLK1, and the duty detection circuit 114 may generate the duty detection signal DDS having a high logic level. The delay control circuit 115 may generate the phase increase signal INC based on the duty detection signal DDS, but may block the output of the up signal UP. Accordingly, the phases of the first and second internal clock signals INCLK1 and INCLK2 might not be changed.

However, the bang-bang control circuit 210 may enable the first and second switching signals CP and CN based on the duty detection signal DDS having a high logic level. When the first and second switching signals CP and CN are enabled, the first and second capacitors 222 and 223 may be turned on, and the delay amount of the first driver 220 may be larger than the delay amount of the second driver 230. Accordingly, the second bang-bang clock signal BCLK2 may have a smaller duty cycle than the first bang-bang clock signal BCLK1, and the duty detection circuit 114 may detect the duty cycles of the first and second bang-bang clock signals BCLK1 and BCLK2 and generate the duty detection signal DDS having a low logic level.

As the update cycle is repeated, the duty cycle of the second bang-bang clock signal BCLK2 may bang with respect to the duty cycle of the first bang-bang clock signal BCLK1, and the duty detection signal DDS having a high logic level and the duty detection signal DDS having a low logic level may be alternately generated every update cycle.

At t2, when the duty cycle of the second internal clock signal INCLK2 is decreased beyond the target duty cycle range, the duty detection circuit 114 may generate the duty detection signal DDS having a low logic level twice or more. The overlock detector 322 of the locking detection circuit 320 may detect that the phase decrease signal DEC is generated twice or more based on the duty detection signal DDS having a low logic level, after the locking signal LOCK is enabled, and enable the reset signal RST. The lock detector 321 may disable the locking signal LOCK based on the reset signal RST. When the locking signal LOCK is disabled, the output driver 330 may output the down signal DN as the delay control signal DC based on the phase decrease signal DEC, and the delay amount of the second delay circuit 112 may be decreased. Accordingly, a difference between the duty cycle of the first internal clock signal INCLK1 and the duty cycle of the second internal clock signal INCLK2 may be decreased again.

Just prior to t3, the duty cycle of the second internal clock signal INCLK2 may be larger than the duty cycle of the first internal clock signal INCLK1. At t3, when the duty cycle of the second internal clock signal INCLK2 is smaller than the duty cycle of the first internal clock signal INCLK1, the duty detection circuit 114 may generate the duty detection signal DDS having a high logic level, and the lock detector 321 may enable the locking signal LOCK again. Because the output driver 330 blocks the output of the delay control signal DC, the duty cycles of the first and second internal clock signals INCLK1 and INCLK2 may be substantially maintained constant.

Even though the duty cycles of the first and second internal clock signals INCLK1 and INCLK2 are substantially maintained constant, the bang-bang driver 113 may allow the bang-bang driving clock signal BCLK2 to bang with respect to the first bang-bang clock signal BCLK1, and the duty detection circuit 114 and the delay control circuit 115 may continuously detect that a difference between the duty cycle of the first internal clock signal INCLK1 and the duty cycle of the second internal clock signal INCLK2 is out of the target duty cycle range. Accordingly, the internal circuit 120 may stably operate in synchronization with an internal clock signal without banging, and the duty detection circuit 114 may continuously detect a change in the duty cycles of the first and second internal clock signals INCLK1 and INCLK2 and allow the duty correction circuit 110 to perform the duty correction operation again when a difference between the duty cycles of the first and second internal clock signals is out of the target duty cycle range.

Figure 6:
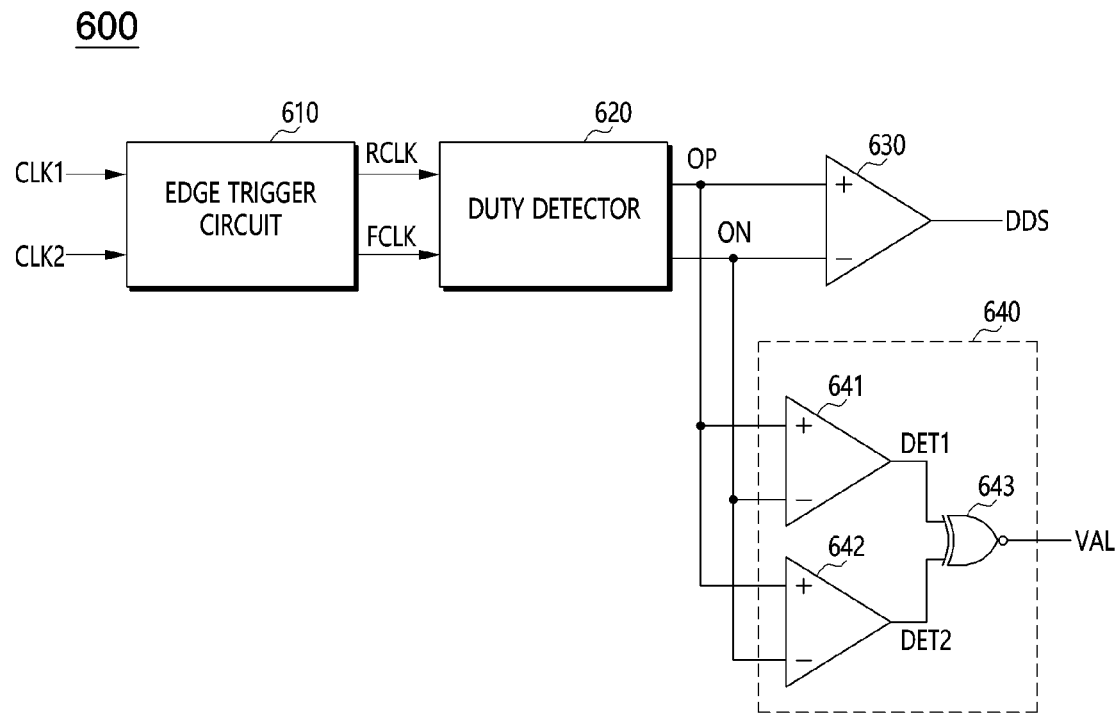
FIG. 6 is a diagram illustrating an example duty detection circuit in accordance with an embodiment of the present disclosure.

FIG. 6 is a diagram illustrating an example duty detection circuit in accordance with an embodiment of the present disclosure. A duty detection circuit 600 may be applied as the duty detection circuit 114 of FIG. 1. Referring to FIG. 6, the duty detection circuit 600 may provide a valid determination signal VAL together with the duty detection signal DDS when it is determined that a duty cycle determination result of an inputted clock signal is valid. The valid determination signal VAL may be used by, for example, the validity generator 900 of FIG. 9.

The duty detection circuit 600 may include an edge trigger circuit 610, a duty detector 620, a comparator 630, and a validity determiner 640. The edge trigger circuit 610 may receive a first input clock signal CLK1 and a second input clock signal CLK2. When the duty detection circuit 600 is applied as the duty detection circuit 114 illustrated in FIG. 1, the first input clock signal CLK1 may correspond to the first bang-bang clock signal BCLK1 and the second input clock signal CLK2 may correspond to the second bang-bang clock signal BCLK2. In an embodiment, the edge trigger circuit 610 may further receive a complementary signal (not illustrated) of the first input clock signal and a complementary signal (not illustrated) of the second input clock signal together with the first input clock signal CLK1 and the second input clock signal CLK2.

The edge trigger circuit 610 may generate a reference clock signal RCLK and a comparison clock signal FCLK based on the first input clock signal CLK1 and the second input clock signal CLK2. The edge trigger circuit 610 may generate the reference clock signal RCLK that is triggered on an edge of the first input clock signal CLK1 and the comparison clock signal FCLK that is triggered on an edge of the second input clock signal CLK2. In an embodiment, the edge trigger circuit 610 may generate the reference clock signal RCLK that is triggered on rising edges and/or falling edges of the first and second input clock signals CLK1 and CLK2 and the comparison clock signal FCLK that is triggered on the falling edges and/or the rising edges of the first and second input clock signals CLK1 and CLK2.

The edges of the first and second input clock signals CLK1 and CLK2 to use for the edge trigger circuit 610 to generate the reference clock signal RCLK and the comparison clock signal FCLK may be changed to either the rising edges or the falling edges. In an embodiment, the edge trigger circuit 610 may generate the reference clock signal RCLK that is triggered on edges of the first input clock signal CLK1 and the complementary signal of the first input clock signal, and generate the comparison clock signal FCLK that is triggered on edges of the second input clock signal CLK2 and the complementary signal of the second input clock signal.

The duty detector 620 may detect duty cycles of the reference clock signal RCLK and the comparison clock signal FCLK and generate a first output signal OP and a second output signal ON. The duty detector 620 may generate the first output signal OP having a voltage level that is changed according to the duty cycle of the reference clock signal RCLK. The duty detector 620 may generate the second output signal ON having a voltage level that is changed according to the duty cycle of the comparison clock signal FCLK. When the reference clock signal RCLK has a larger duty cycle than the comparison clock signal FCLK, the duty detector 620 may generate the first output signal OP having a relatively low voltage level and the second output signal ON having a relatively high voltage level. When the reference clock signal RCLK has a smaller duty cycle than the comparison clock signal FCLK, the duty detector 620 may generate the first output signal OP having a relatively high voltage level and the second output signal ON having a relatively low voltage level.

The comparator 630 may receive the first and second output signals OP and ON and generate the duty detection signal DDS. The comparator 630 may compare the voltage levels of the first and second output signals OP and ON and change the logic level of the duty detection signal DDS. When the first output signal OP has a higher voltage level than the second output signal ON, the comparator 630 may generate the duty detection signal DDS having a high logic level. When the first output signal OP has a lower voltage level than the second output signal ON, the comparator 630 may generate the duty detection signal DDS having a low logic level. The comparator 630 may be configured as a symmetrical differential amplification circuit.

The validity determiner 640 may receive the first and second output signals OP and ON and generate the valid determination signal VAL. The validity determiner 640 may determine validity of the first and second output signals OP and ON and generate the valid determination signal VAL. The validity determiner 640 may asymmetrically amplify the first and second output signals OP and ON and generate the valid determination signal VAL. For example, the validity determiner 640 may set a positive offset and a negative offset to one of the first and second output signals OP and ON, and compare or amplify an output signal to which the offsets are set, thereby verifying whether comparison and amplification results of the comparator 630 are valid.

The validity determiner 640 may set offsets to the first and second output signals OP and ON, respectively. The offset set to the first output signals OP may be substantially identical with the offset to the second output signal ON. When the result of comparing the first output signal OP and the second output signal ON, to which the offset is set, has substantially the same value with the result of comparing the second output signal ON and the first output signal OP, to which the offset is set, the validity determiner 640 may generate the valid determination signal VAL. When the result of comparing the first output signal OP and the second output signal ON, to which the offset is set, has different value from the result of comparing the second output signal ON and the first output signal OP, to which the offset is set, the validity determiner 640 might not enable the valid determination signal VAL to a high voltage level.

The validity determiner 640 may include a first differential amplifier 641, a second differential amplifier 642, and a gating circuit 643. The first differential amplifier 641 may receive the first and second output signals OP and ON. The first differential amplifier 641 may set a positive offset, and asymmetrically differentially amplify the first and second output signals OP and ON to generate a first determination signal DET1. The first differential amplifier 641 may set the offset to the first output signal OP, and differentially amplify the first output signal OP, to which the offset is set, and the second output signal ON to generate the first determination signal DET1.

The second differential amplifier 642 may also receive the first and second output signals OP and ON. The second differential amplifier 642 may set a negative offset, and asymmetrically differentially amplify the first and second output signals OP and ON to generate a second determination signal DET2. The second differential amplifier 642 may set the offset to the second output signal ON, and differentially amplify the second output signal ON, to which the offset is set, and the first output signal OP to generate the second determination signal DET2.

The gating circuit 643 may receive the first and second determination signals DET1 and DET2 and generate the valid determination signal VAL. The gating circuit 643 may enable the valid determination signal VAL when the first and second determination signals DET1 and DET2 have substantially the same logic levels. The gating circuit 643 may disable the valid determination signal VAL when the first and second determination signals DET1 and DET2 have different logic levels.

The gating circuit 643 may include, for example, an exclusive NOR gate. The exclusive NOR gate may receive the first and second determination signals DET1 and DET2 and generate the valid determination signal VAL. The exclusive NOR gate may output the valid determination signal VAL enabled to a high logic level when the logic levels of the first and second determination signals DET1 and DET2 are substantially identical to each other, and output the valid determination signal VAL disabled to a low logic level when the logic levels of the first and second determination signals DET1 and DET2 are different from each other.

Figure 7:
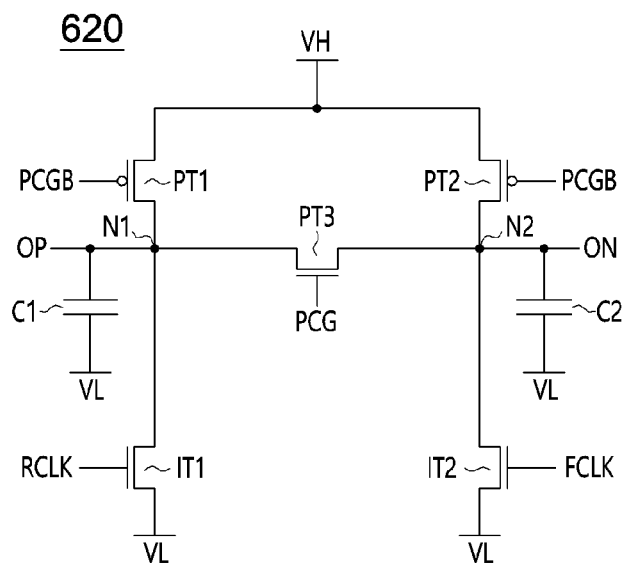
FIG. 7 is a diagram illustrating an example duty detector in accordance with an embodiment of the present disclosure.

FIG. 7 is a diagram illustrating an example duty detector in accordance with an embodiment of the present disclosure. Referring to FIG. 7, the duty detector 620 of FIG. 6 may include a first input transistor IT1, a second input transistor IT2, a first precharge transistor PT1, a second precharge transistor PT2, a third precharge transistor PT3, a first capacitor C1, and a second capacitor C2. The first input transistor IT1 may be connected between a first output node N1 and a terminal to which a low voltage VL is supplied, and may receive the reference clock signal RCLK at its gate. The first input transistor IT1 may be, for example, an N-channel MOS transistor. The second input transistor IT2 may be connected between a second output node N2 and the terminal to which the low voltage VL is supplied, and may receive the comparison clock signal FCLK at its gate. The second input transistor IT2 may be, for example, an N-channel MOS transistor. The first output signal OP may be the signal at the first output node N1 and the second output signal ON may be the signal at the second output node N2.

The first precharge transistor PT1 may be connected between a terminal to which a high voltage VH is supplied and the first output node N1, and may receive a complementary signal PCGB of a precharge signal PCG at its gate. The second precharge transistor PT2 may be connected between the terminal to which the high voltage VH is supplied and the second output node N2, and may receive the complementary signal PCGB of the precharge signal PCG at its gate. The high voltage VH may have a higher voltage level than the low voltage VL. The first and second precharge transistors PT1 and PT2 may each be, for example, a P-channel MOS transistor. The third precharge transistor PT3 may be connected between the first output node N1 and the second output node N2, and may receive the precharge signal PCG at its gate. The third precharge transistor PT3 may be, for example, an N-channel MOS transistor.

The first capacitor C1 may be connected between the terminal to which the low voltage VL is supplied and the first output node N1. The second capacitor C2 may be connected between the terminal to which the low voltage VL is supplied and the second output node N2.

When the precharge signal PCG is enabled to a high logic level, the first to third precharge transistors PT1 to PT3 may be turned on. The first precharge transistor PT1 may provide the high voltage VH to the first output node N1, the second precharge transistor PT2 may provide the high voltage VH to the second output node N2, and the third precharge transistor PT3 may connect the first and second output nodes N1 and N2 to each other. When the high voltage VH is provided to the first and second output nodes N1 and N2, the first and second capacitors C1 and C2 may be charged. When the precharge signal PCG is disabled to a low logic level, the first to third precharge transistors PT1 to PT3 may be turned off and the first and second output nodes N1 and N2 may be electrically isolated from each other.

The first input transistor IT1 may be turned on during a high-level pulse period of the reference clock signal RCLK and may provide the low voltage VL to the first output node N1. Accordingly, the first capacitor C1 may be discharged while the first input transistor IT1 is turned on during the high-level pulse period of the reference clock signal RCLK. The second input transistor IT2 may be turned on during a high-level pulse period of the comparison clock signal FCLK, and provide the low voltage VL to the second output node N2. Accordingly, the second capacitor C2 may be discharged while the second input transistor IT2 is turned on during the high-level pulse period of the comparison clock signal FCLK.

When the duty cycle of the reference clock signal RCLK is larger than that of the comparison clock signal FCLK, the first capacitor C1 may be discharged for a relatively longer time than the second capacitor C2. Therefore, the first output signal OP may have a lower voltage level than the second output signal ON. When the duty cycle of the comparison clock signal FCLK is larger than that of the reference clock signal RCLK, the second capacitor C2 may be discharged for a relatively longer time than the first capacitor C1. Therefore, the second output signal ON may have a lower voltage level than the first output signal OP.

Figure 8:
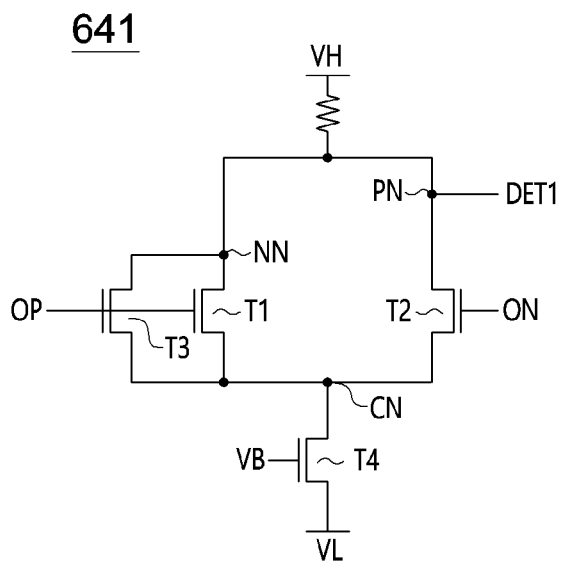
FIG. 8 is a diagram illustrating an example first differential amplifier in accordance with an embodiment of the present disclosure.

FIG. 8 is a diagram illustrating an example first differential amplifier used in accordance with an embodiment of the disclosure. Referring to FIG. 8, the first differential amplifier 641 may include a first transistor T1, a second transistor T2, a third transistor T3, and a fourth transistor T4. The first transistor T1 may be connected between a negative output node NN and a common node CN, and may receive the first output signal OP through its gate. The second transistor T2 may be connected between a positive output node PN and the common node CN, and may receive the second output signal ON through its gate. The third transistor T3 may be connected in parallel with the first transistor T1 between the negative output node NN and the common node CN, and may receive the first output signal OP through its gate. The first and third transistors T1 and T3 may each be, for example, an N-channel MOS transistor. The second and fourth transistors T2 and T4 may also be N-channel MOS transistors.

The terminal to which the high voltage VH is supplied may be connected in common to the negative output node NN and the positive output node PN. The first determination signal DET1 may be outputted from the positive output node PN. The first and second transistors T1 and T2 may have substantially the same size, and the third transistor T3 may have a smaller size than the first and second transistors T1 and T2. The fourth transistor T4 may be connected between the common node CN and the terminal to which the low voltage VL is supplied, and may receive a bias voltage VB through its gate. The high voltage VH may have a higher voltage level than the low voltage VL. A first terminal of a load resistor or a de-generation resistor may be connected to the terminal to which the high voltage VH is supplied, and a second terminal of the load resistor may be connected to the positive output node PN and the negative output node NN.

The first and third transistors T1 and T3 may be formed to have a different size than the second transistor T2. Accordingly, the first, second, and third transistors T1-T3 may set an offset to the first output signal OP of the duty detector 620, and asymmetrically amplify the first and second output signals OP and ON of the duty detector 620.

The second differential amplifier 642 may have a structure complementary to the first differential amplifier 641 in order to set an offset having an opposite polarity. Accordingly, the second differential amplifier 642 may have one transistor for receiving the first output signal OP and two transistors for receiving the second output signal ON. Otherwise the configuration of the second differential amplifier 642 may be similar to the configuration of the first differential amplifier 641.

Figure 9:
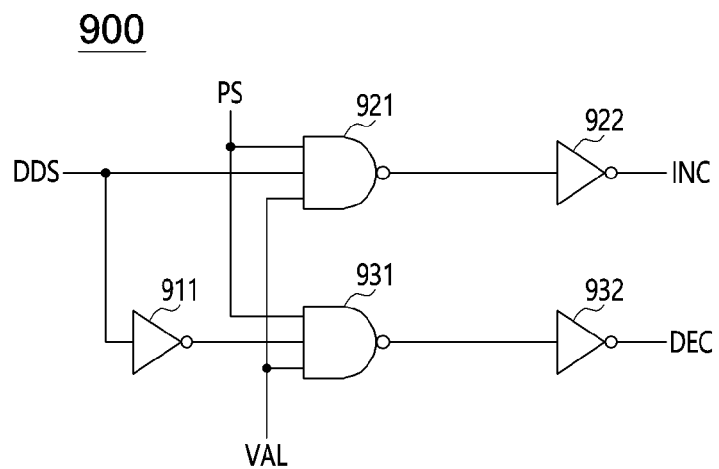
FIG. 9 is a diagram illustrating an example validity generator when a duty detection circuit is applied as a duty detection circuit in accordance with an embodiment of the present disclosure.

FIG. 9 is a diagram illustrating an example validity generator in accordance with an embodiment of the present disclosure. When the duty detection circuit 600 illustrated in FIG. 6 is applied as the duty detection circuit 114 illustrated in FIG. 1, the validity generator 310 illustrated in FIG. 4 may be replaced with a validity generator 900. When the valid determination signal VAL is enabled, the validity generator 900 may generate the phase increase signal INC and the phase decrease signal DEC according to the duty detection signal DDS.

The validity generator 900 may include a first inverter 911, a first NAND gate 921, a second inverter 922, a second NAND gate 931, and a third inverter 932. The first NAND gate 921 may receive the duty detection signal DDS, the valid determination signal VAL, and the pulse signal PS. When the valid determination signal VAL has a high logic level and the duty detection signal DDS has a high logic level, the first NAND gate 921 may output a signal that is enabled to a low logic level by the pulse width of the pulse signal PS. The second inverter 922 may invert output of the first NAND gate 921 and output an inverted signal as the phase increase signal INC.

The first inverter 911 may receive the duty detection signal DDS and invert the duty detection signal DDS. The second NAND gate 931 may receive an output signal of the first inverter 911, the valid determination signal VAL, and the pulse signal PS. When the valid determination signal VAL has a high logic level and the duty detection signal DDS has a low logic level, the second NAND gate 931 may output a signal that is enabled to a low logic level by the pulse width of the pulse signal PS. The third inverter 932 may invert output of the second NAND gate 931 and output an inverted signal as the phase decrease signal DEC.

Figure 10:
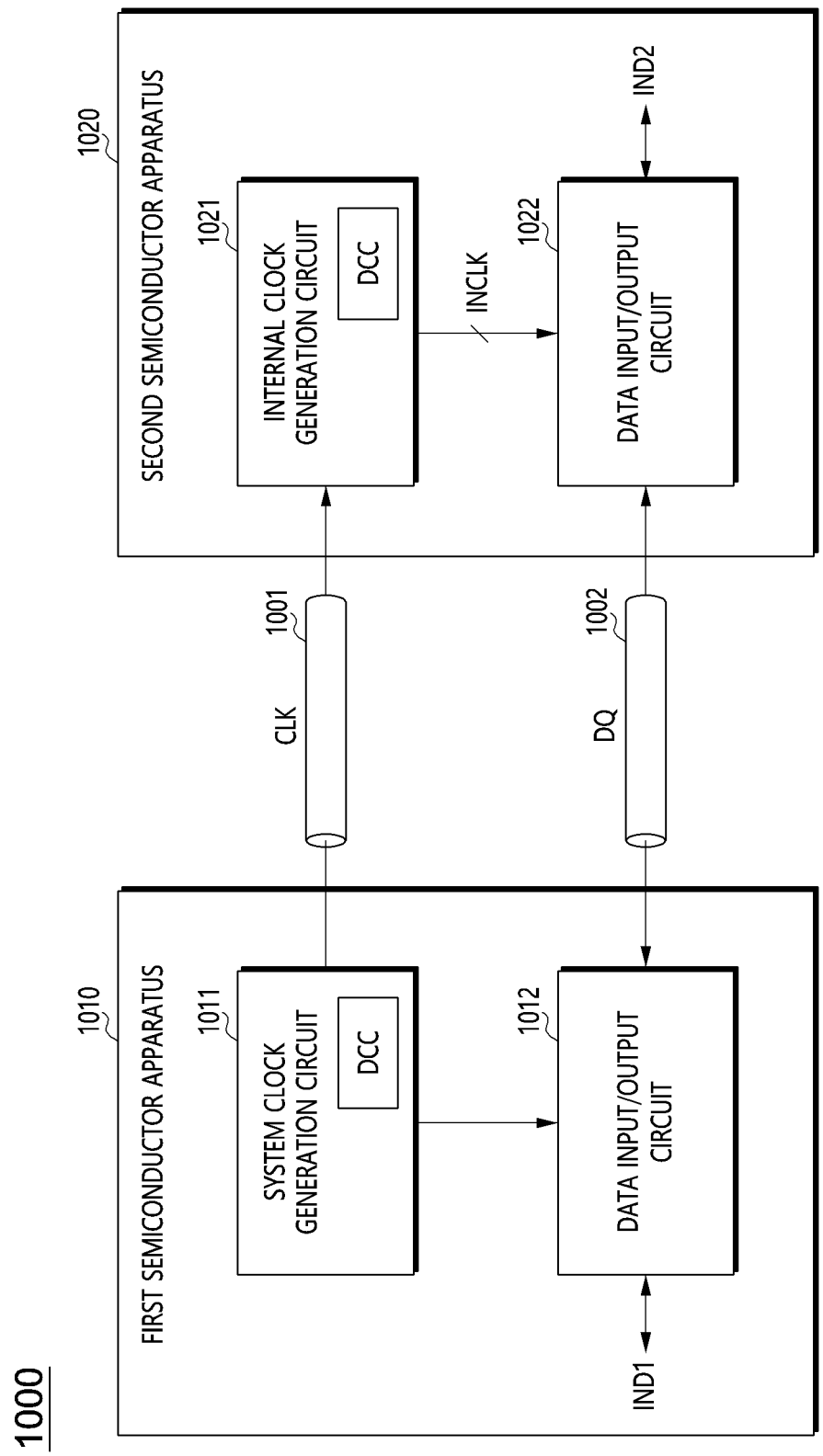
FIG. 10 is a diagram illustrating an example semiconductor system in accordance with an embodiment of the present disclosure.

FIG. 10 is a diagram illustrating an example semiconductor system in accordance with an embodiment of the present disclosure. Referring to FIG. 10, a semiconductor system 1000 may include a first semiconductor apparatus 1010 and a second semiconductor apparatus 1020. The first semiconductor apparatus 1010 may provide various control signals required when the second semiconductor apparatus 1020 operates.

The first semiconductor apparatus 1010 may include various types of devices. For example, the first semiconductor apparatus 1010 may be a host device such as, for example, a central processing unit (CPU), a graphic processing unit (GPU), a multimedia processor (MMP), a digital signal processor, an application processor (AP), a memory controller, etc. The second semiconductor apparatus 1020 may be, for example, a memory apparatus, and the memory apparatus may include volatile memory and/or nonvolatile memory. Examples of volatile memory may include static RAM (SRAM), dynamic RAM (DRAM), synchronous DRAM (SDRAM), etc. Examples of nonvolatile memory may include read only memory (ROM), programmable ROM (PROM), electrically erasable and programmable ROM (EEPROM), electrically programmable ROM (EPROM), flash memory, phase-change RAM (PRAM), magnetic RAM (MRAM), resistive RAM (RRAM), ferroelectric RAM (FRAM), and the like.

The second semiconductor apparatus 1020 may communicate with the first semiconductor apparatus 1010 through one or more buses. The one or more buses may be signal transmission paths, links, and/or channels for transmitting signals. The one or more buses may include, for example, a clock bus 1001, a data bus 1002, and the like. Although not illustrated in the drawing, the one or more buses may further include, for example, a command bus, an address bus, and the like in order to transmit control signals and address signals from the first semiconductor apparatus 1010 to the second semiconductor apparatus 1020.

The clock bus 1001 may be a unidirectional bus from the first semiconductor apparatus 1010 to the second semiconductor apparatus 1020, and the data bus 1002 may be a bidirectional bus. The second semiconductor apparatus 1020 may be connected to the first semiconductor apparatus 1010 through the clock bus 1001 and may receive a system clock signal CLK through the clock bus 1001. The system clock signal CLK may include one or more clock signal pairs. The second semiconductor apparatus 1020 may be connected to the first semiconductor apparatus 1010 through the data bus 1002, and may receive data DQ from the first semiconductor apparatus 1010 or transmit the data DQ to the first semiconductor apparatus 1010 through the data bus 1002.

The first semiconductor apparatus 1010 may include a system clock generation circuit 1011 and a data input/output circuit 1012. The system clock generation circuit 1011 may generate the system clock signal CLK, and transmit the system clock signal CLK to the second semiconductor apparatus 1020 through the clock bus 1001. The system clock signal CLK may have a reference phase to which the first and second semiconductor apparatuses 1010 and 1020 are synchronized to perform data communication.

The system clock generation circuit 1011 may include all circuits and/or devices for generating a clock signal. For example, the system clock generation circuit 1011 may include at least one of an oscillator, a phase locked loop circuit, and a delay locked loop circuit. The system clock generation circuit 1011 may include a duty correction circuit DCC, which may be similar to the duty correction circuit 110 of FIG. 1. The duty correction circuit DCC may correct a duty cycle of the system clock signal CLK.

The data input/output circuit 1012 may receive the system clock signal CLK and internal data IND1 of the first semiconductor apparatus 1010. Although not illustrated in the drawing, the first semiconductor apparatus 1010 may further include a data storage area for storing the internal data IND1. The data input/output circuit 1012 may output the internal data IND1 as the data DQ in synchronization with the system clock signal CLK and transmit the data DQ to the second semiconductor apparatus 1020 through the data bus 1002.

The data input/output circuit 1012 may receive the data DQ transmitted from the second semiconductor apparatus 1020 through the data bus 1002. The data input/output circuit 1012 may generate the internal data IND1 for the first semiconductor apparatus 1010 from the data DQ in synchronization with the system clock signal CLK. In an embodiment, the data input/output circuit 1012 may receive the data DQ from the second semiconductor apparatus 1020 in synchronization with a strobe signal provided together with the data DQ, and generate the internal data IND1 of the first semiconductor apparatus 1010. The strobe signal may have a phase synchronized with the system clock signal CLK.

The second semiconductor apparatus 1020 may include an internal clock generation circuit 1021 and a data input/output circuit 1022. The internal clock generation circuit 1021 may be connected to the clock bus 1001, and receive the system clock signal CLK transmitted from the first semiconductor apparatus 1010 through the clock bus 1001. The internal clock generation circuit 1021 may generate an internal clock signal INCLK based on the system clock signal CLK. The internal clock generation circuit 1021 may generate the internal clock signal INCLK by delaying the system clock signal CLK to compensate for a modeled delay time. The modeled delay time may be a delay time generated while the system clock signal CLK passes through an internal circuit path of the second semiconductor apparatus 1020. The internal clock generation circuit 1021 may include a phase locked loop circuit or a delay locked loop circuit. The internal clock generation circuit 1021 may include the duty correction circuit DCC, which may correct a duty cycle of the internal clock signal INCLK.

The data input/output circuit 1022 may receive the internal clock signal INCLK and internal data IND2 of the second semiconductor apparatus 1020. Although not illustrated in the drawing, the second semiconductor apparatus 1020 may further include a data storage area for storing the internal data IND2. The data input/output circuit 1022 may output the internal data IND2 as the data DQ in synchronization with the internal clock signal INCLK and transmit the data DQ to the first semiconductor apparatus 1010 through the data bus 1002. The data input/output circuit 1022 may receive the data DQ transmitted from the first semiconductor apparatus 1010 through the data bus 1002. The data input/output circuit 1022 may generate the internal data IND2 of the second semiconductor apparatus 1020 from the data DQ in synchronization with the internal clock signal INCLK.

While the clock bus 1001, the data bus 1002, etc., may have been described as separate buses, they may also be thought of as a single bus with multiple functional signal paths. Accordingly, the communication path between the first semiconductor apparatus 1010 and the second semiconductor apparatus 1020 may be said to have different number of buses depending on what description is used.

A person skilled in the art to which the present disclosure pertains can understand that the present disclosure may be carried out in other specific forms without changing its technical spirit or essential features. Therefore, it should be understood that various embodiments described above are illustrative in all respects, not limitative. The scope of the present disclosure is defined by the claims below in concert with the detailed description and the drawings. Accordingly, it should be understood that the meaning and scope of the present disclosure includes the claims and all modifications or modified forms derived from the equivalent concepts thereof as well as various embodiments in keeping with the technical spirit of the present disclosure.

What is claimed is:

1. A duty correction circuit comprising:
    a first delay circuit configured to delay an input clock signal to generate a first delayed clock signal;
    a second delay circuit configured to variably delay the input clock signal based on a delay control signal to generate a second delayed clock signal;
    a bang-bang driver configured to:
        drive the first and second delayed clock signals to generate a first driving clock signal and a second driving clock signal; and
        delay the first and second driving clock signals based on a locking signal and a duty detection signal;
    a duty detection circuit configured to detect duty cycles of the first and second driving clock signals and generate the duty detection signal; and
    a delay control circuit configured to generate the locking signal and the delay control signal based on the duty detection signal.

2. The duty correction circuit according to claim 1, wherein, when the locking signal is enabled, the bang-bang driver is configured to further delay, based on the duty detection signal, one of the first and second driving clock signals compared to the other of the first and second driving clock signals.

3. The duty correction circuit according to claim 1, wherein the delay control circuit comprises:
    a validity generator configured to generate a phase increase signal and a phase decrease signal based on the duty detection signal;
    a locking detection circuit configured to generate the locking signal based on the phase increase signal and the phase decrease signal; and
    an output driver configured to output the phase increase signal and the phase decrease signal as the delay control signal based on the locking signal.

4. The duty correction circuit according to claim 3, wherein, when one of the phase increase signal and the phase decrease signal is continuously generated and then the other one is generated, the locking detection circuit is configured to enable the locking signal.

5. The duty correction circuit according to claim 3, wherein, after the locking signal is enabled, when one of the phase increase signal and the phase decrease signal is continuously generated, the locking detection circuit is configured to disable the locking signal.

6. The duty correction circuit according to claim 3, wherein the locking detection circuit comprises:
    a lock detector configured to enable the locking signal when one of the phase increase signal and the phase decrease signal is continuously generated and then the other one is generated, and to disable the locking signal based on a reset signal; and
    an overlock detector configured to enable the reset signal when one of the phase increase signal and the phase decrease signal is continuously generated after the locking signal is enabled.

7. The duty correction circuit according to claim 3, wherein the output driver is configured to:
    output the phase increase signal and the phase decrease signal as the delay control signal when the locking signal is disabled, and
    block output of the phase increase signal and the phase decrease signal as the delay control signal when the locking signal is enabled.

8. The duty correction circuit according to claim 1, wherein the duty detection circuit comprises:
    an edge trigger circuit configured to generate a reference clock signal and a comparison clock signal based on the first and second driving clock signals;
    a duty detector configured to generate a first output signal having a voltage level that is changed according to a duty cycle of the reference clock signal and a second output signal having a voltage level that is changed according to a duty cycle of the comparison clock signal;
    a comparator configured to compare the first and second output signals and generate the duty detection signal; and
    a validity determiner configured to determine validity of the first and second output signals and generate a valid determination signal.

9. The duty correction circuit according to claim 8, wherein the validity determiner further comprises:

a first differential amplifier configured to set a positive offset, and amplify the first and second output signals to generate a first detection signal;

a second differential amplifier configured to set a negative offset, and amplify the first and second output signals to generate a second detection signal; and a gating circuit configured to enable the valid determination signal when logic levels of the first and second detection signals are substantially identical to each other.

10. The duty correction circuit according to claim 8, wherein, when the valid determination signal is enabled, the duty detection circuit is configured to generate the phase increase signal and the phase decrease signal based on the duty detection signal.

11. A duty correction circuit comprising:

a first delay circuit configured to delay an input clock signal to generate a first delayed clock signal;

a second delay circuit configured to variably delay the input clock signal based on a delay control signal to generate a second delayed clock signal;

a bang-bang driver configured to drive the first and second delayed clock signals to generate a first driving clock signal and a second driving clock signal, and to delay the first and second driving clock signals based on a locking signal and a duty detection signal;

a duty detection circuit configured to detect duty cycles of the first and second driving clock signals and generate the duty detection signal; and a delay control circuit configured to:
generate the delay control signal and the locking signal based on the duty detection signal;
output the delay control signal based on the duty detection signal when the locking signal is disabled; and
block output of the delay control signal when the locking signal is enabled.

12. The duty correction circuit according to claim 11, wherein, when the locking signal is enabled, the bang-bang driver is configured to further delay one of the first and second driving clock signals compared to the other of the first and second driving clock signals based on the duty detection signal.

13. The duty correction circuit according to claim 11, wherein the delay control circuit comprises:

a validity generator configured to generate a phase increase signal and a phase decrease signal based on the duty detection signal;

a locking detection circuit configured to generate the locking signal based on the phase increase signal and the phase decrease signal; and an output driver configured to output the phase increase signal and the phase decrease signal as the delay control signal based on the locking signal.

14. The duty correction circuit according to claim 13, wherein, when any one of the phase increase signal and the phase decrease signal is continuously generated and then the other one is generated, the locking detection circuit is configured to enable the locking signal, and after the locking signal is enabled, when any one of the phase increase signal and the phase decrease signal is continuously generated, the locking detection circuit is configured to disable the locking signal.

15. The duty correction circuit according to claim 13, wherein the locking detection circuit comprises:

a lock detector configured to enable the locking signal when any one of the phase increase signal and the phase decrease signal is continuously generated and then the other one is generated, and to disable the locking signal based on a reset signal; and an overlock detector configured to enable the reset signal when any one of the phase increase signal and the phase decrease signal is continuously generated after the locking signal is enabled.

16. The duty correction circuit according to claim 13, wherein the output driver is configured to output the phase increase signal and the phase decrease signal as the delay control signal when the locking signal is disabled, and block output of the phase increase signal and the phase decrease signal as the delay control signal when the locking signal is enabled.

\* \* \* \* \*